United States Patent
Li

(10) Patent No.: US 9,577,632 B2
(45) Date of Patent: Feb. 21, 2017

(54) WIRELESS SWITCHING CIRCUIT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Jia Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 804 days.

(21) Appl. No.: 13/965,230

(22) Filed: Aug. 13, 2013

(65) Prior Publication Data

US 2014/0175904 A1    Jun. 26, 2014

(30) Foreign Application Priority Data

Dec. 22, 2012 (CN) .......................... 2012 1 05617704

(51) Int. Cl.
| | | |
|---|---|---|
| *H03K 17/94* | (2006.01) | |
| *H01R 13/66* | (2006.01) | |
| *H01R 13/70* | (2006.01) | |

(52) U.S. Cl.
CPC ......... *H03K 17/941* (2013.01); *H01R 13/6683* (2013.01); *H01R 13/70* (2013.01);
(Continued)

(58) Field of Classification Search
None
See application file for complete search history.

(56) References Cited

U.S. PATENT DOCUMENTS

| | | | | | |
|---|---|---|---|---|---|
| 4,656,351 | A | * | 4/1987 | Reichlin | ................ H03K 17/16 250/221 |
| 6,552,888 | B2 | * | 4/2003 | Weinberger | .......... H01R 13/713 307/125 |

(Continued)

OTHER PUBLICATIONS

"Thyristor", Aug. 15, 2012, Wikipedia, retrieved from <http://web.archive.org/web/20120815003211/http://en.wikipedia.org/wiki/Thyristor>.*

(Continued)

*Primary Examiner* — Rexford Barnie
*Assistant Examiner* — David Shiao
(74) *Attorney, Agent, or Firm* — Zhigang Ma

(57) ABSTRACT

A wireless switching circuit includes a charging capacitor, a voltage converter, an infrared sensor unit, a single chip microcomputer (SCM), a zero trigger circuit, and a thyristor. The charging capacitor is used to store and supply power. The voltage converter is used to convert alternating current (AC) voltage into direct current (DC) voltage to charge the charging capacitor. The infrared sensor unit is used to output control signals according to sensed infrared signals. The SCM outputs a trigger signal according to the control signals from the infrared sensor unit. Input ends of the zero trigger circuit are connected to the SCM to receive the trigger signal. An anode and a cathode of the thyristor is connected to a power supply line for the socket. A control end of the thyristor is connected to an output end of the zero trigger circuit.

4 Claims, 2 Drawing Sheets

(52) U.S. Cl.
CPC ........... *H03K 2217/0081* (2013.01); *H03K 2217/94106* (2013.01); *Y10T 307/773* (2015.04)

(56) References Cited

U.S. PATENT DOCUMENTS

| | | | | |
|---|---|---|---|---|
| 2001/0045803 | A1* | 11/2001 | Cencur | H03K 17/955 315/291 |
| 2005/0250377 | A1* | 11/2005 | Gorman | H01R 31/065 439/535 |
| 2006/0232333 | A1* | 10/2006 | Pirondini | H02H 3/12 330/253 |
| 2007/0046107 | A1* | 3/2007 | Jayaram | F24H 3/0417 307/117 |
| 2008/0238907 | A1* | 10/2008 | Wang | G06F 1/3203 345/211 |
| 2010/0079001 | A1* | 4/2010 | Lee | G06F 1/266 307/40 |
| 2010/0270982 | A1* | 10/2010 | Hausman, Jr. | H02M 5/293 320/166 |
| 2011/0163600 | A1* | 7/2011 | Garb | H01R 13/6675 307/35 |

OTHER PUBLICATIONS

"Triac", Aug. 15, 2012, Wikipedia, retrieved from <http://web.archive.org/web/20120815205736/http://en.wikipedia.org/wiki/TRIAC>.*

* cited by examiner

WIRELESS SWITCHING CIRCUIT

BACKGROUND

1. Technical Field

The present disclosure relates to a wireless switching circuit.

2. Description of Related Art

Users often use remote devices to turn off electronic equipment. The electronic equipment will still consume power when in a standby mode. A good way to save power is to unplug a power plug of the electronic equipment, which is not efficient.

Therefore, there is room for improvement in the art.

BRIEF DESCRIPTION OF THE DRAWINGS

Many aspects of the present disclosure can be better understood with reference to the following drawing(s). The components in the drawing(s) are not necessarily drawn to scale, the emphasis instead being placed upon clearly illustrating the principles of the present disclosure. Moreover, in the drawing(s), like reference numerals designate corresponding parts throughout the several views.

DETAILED DESCRIPTION

Figure 1:
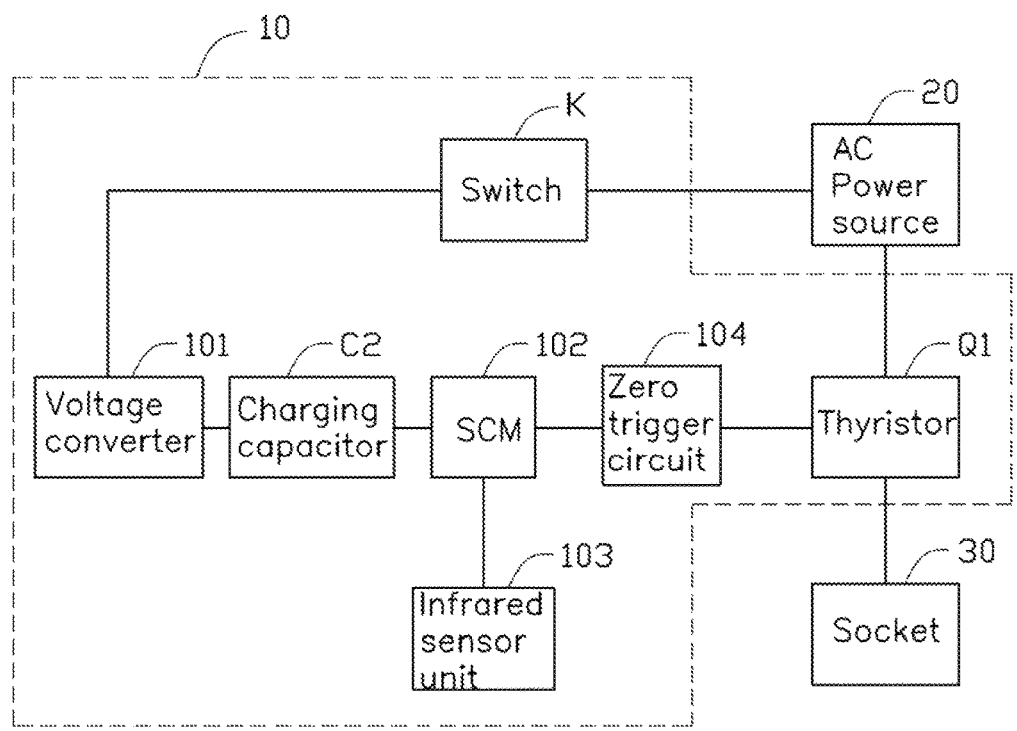
FIG. 1 is a block diagram of an embodiment of a wireless switching circuit of the present disclosure.

FIG. 1 shows an embodiment of a wireless switching circuit 10 of the present disclosure.

The wireless switching circuit 10 includes a voltage converter 101, a single chip microcomputer (SCM) 102, an infrared sensor unit 103, a zero trigger circuit 104, a thyristor Q1, a charging capacitor C2, and a switch K.

The voltage converter 101 is connected to an alternating current (AC) power source 20 through the switch K. The charging capacitor C2 is connected between the SCM 102 and the voltage converter 101. The SCM 102 is connected to the infrared sensor unit 103 and an input end of the zero trigger circuit 104. An output end of the zero trigger circuit 104 is connected to the thyristor Q1. The thyristor Q1 is connected to a socket 30.

The infrared sensor unit 103 is used to output a power signal or a standby signal to the SCM 102 according to infrared signals sensed by the infrared sensor unit 103. The switch K is turned off by default and turns on when pressed.

When receiving a power signal, the SCM 102 outputs a trigger signal to the zero trigger circuit 104. The zero trigger circuit 104 will turn on the thyristor Q1, and the socket 30 is connected to the AC power source 20 receiving AC power.

When receiving a standby signal, the SCM 102 stops outputting the trigger signal. The zero trigger circuit 104 will turn off the thyristor Q1. The switch K is off by default. The socket 30 is disconnected from the AC 20.

Figure 2:
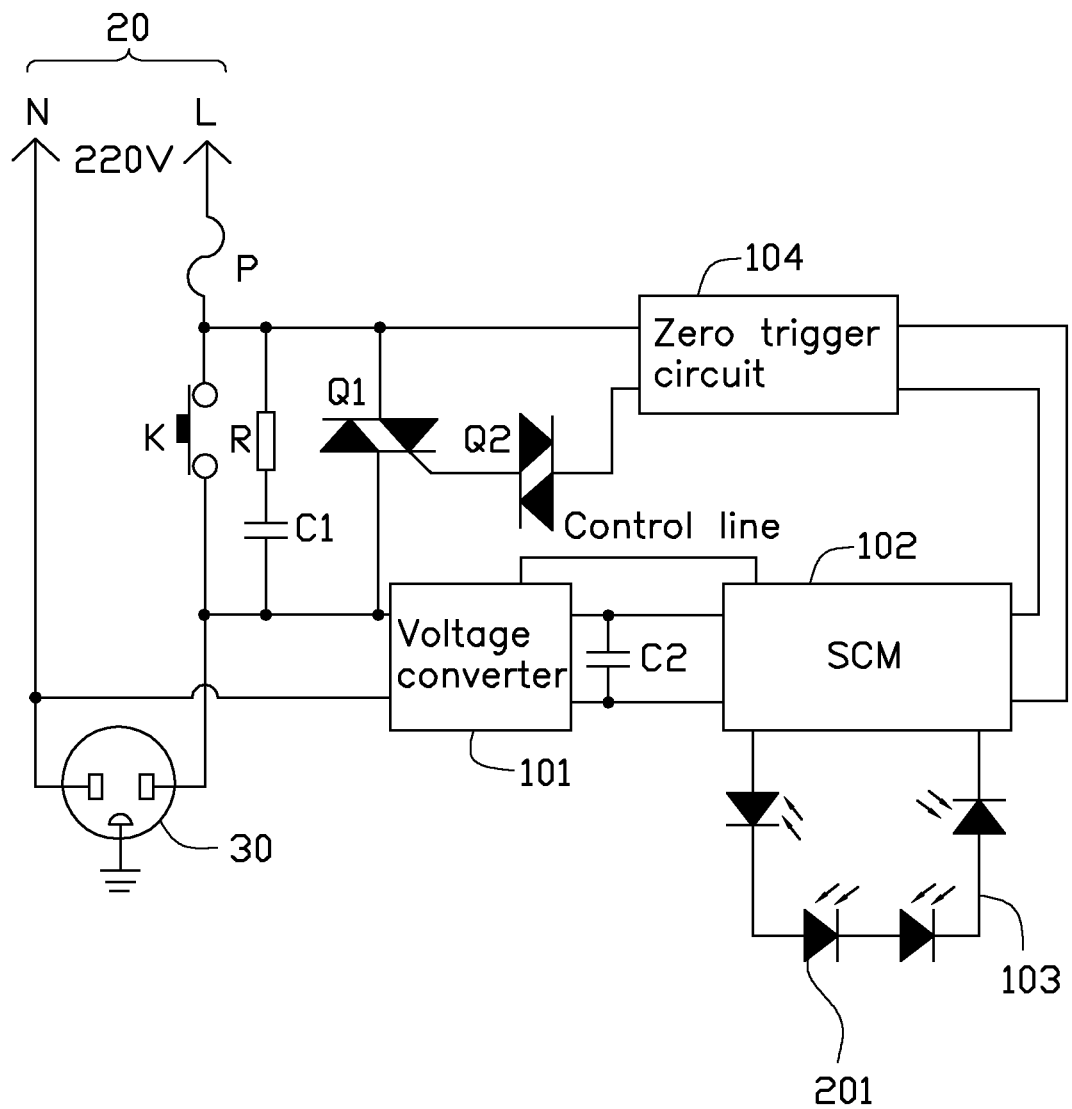
FIG. 2 is a circuit diagram of the wireless switching circuit of FIG. 1.

FIG. 2 shows a circuit of the embodiment of the wireless switching circuit 10.

A first input end of the voltage converter 101 is connected to a zero line N of the AC power source 20. A second input end of the voltage converter 101 is connected to a live line L of the AC power source 20 through the switch K and a fuse P in that order. A first end of the charging capacitor C2 is connected to a first output end of the voltage converter 101, and a second output end of the voltage converter 101 is connected to a second end of the charging capacitor C2.

A first input end of the SCM 102 is connected to the first end of the charging capacitor C2. A second input end of the SCM 102 is connected to the second end of the charging capacitor C2. A first output end of the SCM 102 is connected to a first input end of the zero trigger circuit 104. A second output end of the SCM 102 is connected to a second input end of the zero trigger circuit 104. The infrared sensor unit 103 is connected in series between a third input end and a fourth input end of the SCM 102.

A first output end of the zero trigger circuit 104 is connected to an anode of a trigger diode Q2, and the first output end of the zero trigger circuit 104 is connected to a control end of the thyristor Q1 through the trigger diode Q2. A second output end of the zero trigger circuit 104 is connected to an anode of the thyristor Q1. The anode of the thyristor Q1 is connected to a node between the switch K and the fuse P. A cathode of the thyristor Q1 is connected to a node between the switch K and the socket 30. In at least one exemplary embodiment, the thyristor Q1 is a triac, and the trigger diode Q2 is a diac.

A resistor R and a filter capacitor C1 are connected in series. The series circuit and the switch K are connected in parallel.

A first end of the socket 30 is connected to the first input end of the voltage converter 101. A second end of the socket 30 is connected to the second input end of the voltage converter 101. A third end of the socket 30 is grounded.

In this embodiment, the voltage converter 101 is used to convert the AC voltage from the AC power source 20 into constant direct current (DC) voltage to charge the charging capacitor C2. The charging capacitor C2 is used to supply power for the SCM 102.

In this embodiment, the infrared sensor unit 103 includes a number of infrared silicon photocells 201. The infrared silicon photocells are used to output the power signal or the standby signal to the SCM 102 according to the sensed infrared signals.

When receiving the power signal, the SCM 102 outputs trigger signals through the first output end and the second output end to the zero trigger circuit 104. The zero trigger circuit receives the trigger signals and outputs a first positive voltage to the anode of the thyristor Q1 and outputs a second positive voltage to the control end of the thyristor Q1 through the trigger diode Q2. The thyristor Q1 is turned on. The AC power source 20 is connected to the socket 30 through the thyristor Q1.

When receiving the standby signal, the SCM 102 stops outputting the trigger signals. The zero trigger circuit 104 stops outputting the positive voltages. The thyristor Q1 is turned off. The socket 30 is disconnected from the AC power source 20.

In this embodiment, the trigger diode Q2 is used to improve the reliability of the thyristor Q1. The resistor R and the filter capacitor C1 are used to reduce the influence of pulses on the thyristor Q1.

The switch K is used to start the wireless switching circuit 10 when the charging capacitor C2 does not have enough power for the operation of the SCM 102. The voltage converter 101 outputs a wakeup signal to the SCM 102 through a control line to wake the SCM 102 up. When the switch K is pressed, the AC power source 20 is connected to the voltage converter 101. The voltage converter 101 charges the charging capacitor C2. When the switch K is not pressed, the AC power source 20 is disconnected from the voltage converter 101, and the voltage converter 101 stops charging the charging capacitor C2.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A wireless switching circuit, comprising:
   a charging capacitor;
   a voltage converter connected to the charging capacitor;
   a switch connecting the voltage converter to an alternating current (AC) power source;
   wherein the voltage converter converts AC voltage from the AC power source into direct current (DC) voltage to charge the charging capacitor when the switch is turned on;
   an infrared sensor unit to output a power signal or a standby signal according to infrared signals sensed by the infrared sensor unit;
   a single chip microcomputer (SCM) connected to the infrared sensor unit and the charging capacitor, wherein the SCM outputs a trigger signal when receiving the power signal from the infrared sensor and stops outputting the trigger signal when receiving the standby signal from the infrared sensor;
   a zero trigger circuit connected to the SCM, wherein input ends of the zero trigger circuit are connected to the SCM to receive the trigger signal;
   a triac connected to a socket, wherein an anode of the triac is connected to a zero line of the AC power source, a cathode of the triac is connected to the anode of the triac through the switch; a control end of the triac is connected to an output end of the zero trigger circuit; when the zero trigger circuit receives the trigger signal from the SCM, the triac is turned on, and the AC power source is connected to the socket; when the zero trigger circuit does not receive the trigger signal from the SCM, the triac is turned off, and the AC power source is disconnected from the socket;
   wherein the voltage converter has a first input, connected between the switch and a first end of the socket, and a second input connected between a second end of the socket and the zero line of the AC power source; and
   wherein the switch is connected in parallel with the triac.

2. The wireless switching circuit of claim 1, further comprising a diac, wherein the diac is connected between the zero trigger circuit and the triac.

3. The wireless switching circuit of claim 2, further comprising a resistor and a filter capacitor, where in the resistor and the filter capacitor are connected in series, and connected to the switch in parallel.

4. The wireless switching circuit of claim 3, further comprising a fuse, wherein the fuse is connected to a live line of the AC power source and connected to the anode of the triac.

\* \* \* \* \*